（12）United States Patent
Liu et al.

(10) Patent No.: US 7,718,998 B2
(45) Date of Patent: May 18, 2010

(54) THIOPHENE ELECTRONIC DEVICES (75) Inventors: Ping Liu, Mississauga (CA); Beng S. Ong, Mississauga (CA); Yiliang Wu, Mississauga (CA); Yuning Li, Mississauga (CA); Hualong Pan, Hamilton (CA)

(73) Assignee: Xerox Corporation, Norwalk, CT (US)

( * ) Notice: Subject to any disclaimer, the term of this patent is extended or adjusted under 35 U.S.C. 154(b) by 647 days.

(21) Appl. No.: 11/638,725

(22) Filed: Dec. 14, 2006

(65) Prior Publication Data

US 2008/0146776 A1   Jun. 19, 2008

(51) Int. Cl.
*H01L 51/00* (2006.01)
*C08G 61/12* (2006.01)
*C08G 75/00* (2006.01)

(52) U.S. Cl. .................. 257/40; 257/E51.029; 438/99; 528/377; 528/380

(58) Field of Classification Search ........................ None
See application file for complete search history.

(56) References Cited

U.S. PATENT DOCUMENTS

| | | | |
|---|---|---|---|
| 5,619,357 A | 4/1997 | Angelopoulos et al. | |
| 5,777,070 A | 7/1998 | Inbasekaran et al. | |
| 5,969,376 A | 10/1999 | Bao et al. | |
| 6,107,117 A | 8/2000 | Bao et al. | |
| 6,150,191 A | 11/2000 | Bao | |
| 6,770,904 B2 | 8/2004 | Ong et al. | |
| 6,774,393 B2 | 8/2004 | Murti et al. | |
| 7,524,922 B2 * | 4/2009 | Heeney et al. | 528/380 |
| 2005/0017311 A1 | 1/2005 | Ong et al. | |
| 2006/0124921 A1 | 6/2006 | Ong et al. | |
| 2006/0214155 A1 | 9/2006 | Ong et al. | |
| 2007/0028962 A1 * | 2/2007 | Jung et al. | 136/263 |
| 2009/0025781 A1 * | 1/2009 | Iida et al. | 136/252 |

FOREIGN PATENT DOCUMENTS

| | | | |
|---|---|---|---|
| FR | 2 881 745 | * | 8/2006 |
| WO | WO 2006/120939 | * | 11/2006 |

* cited by examiner

*Primary Examiner*—Marc S Zimmer
(74) *Attorney, Agent, or Firm*—Fay Sharpe LLP

(57) ABSTRACT

An electronic device, such as a thin film transistor, containing a semiconductor of Formula/Structure (I)

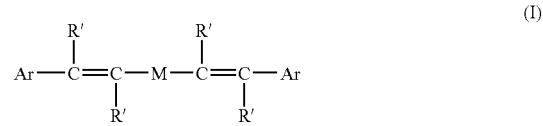

wherein each R' is independently at least one of hydrogen, and a suitable hydrocarbon; Ar is an aryl, inclusive of heteroaryl substituents; and M represents at least one thiophene based conjugated segment.

14 Claims, 2 Drawing Sheets

THIOPHENE ELECTRONIC DEVICES

CROSS REFERENCE TO RELATED APPLICATIONS

Illustrated in copending U.S. application Ser. No. 11/638,726, filed on Dec. 14, 2006, the disclosure of which is totally incorporated herein by reference, is an electronic device comprising a semiconductor of the Formula/Structure (I)

wherein X is one of O or NR'; m represents the number of methylenes; M is a conjugated moiety; R and R' are selected from the group consisting of at least one of hydrogen, a suitable hydrocarbon, and a suitable hetero-containing group; a represents the number of 3-substituted thiophene units; b represents the number of conjugated moieties, and n represents the number of repeating units of the polymer.

U.S. application Ser. No. 11/586,449, filed Oct. 25, 2006 on Electronic Devices by Beng S. Ong et al.

U.S. application Ser. No. 11/586,448, filed Oct. 25, 2006 on Poly(dithienylbenzo[1,2-b:4,5-b']dithiophene) Polymers by Beng S. Ong et al.

U.S. application Ser. No. 11/398,981, filed Apr. 6, 2006 on Functionalized Heteroacenes and Electronic Devices Generated Therefrom by Yuning Li et al.

U.S. application Ser. No. 11/399,226, filed Apr. 6, 2006 on Functionalized Heteroacenes by Yuning Li et al.

U.S. application Ser. No. 11/399,216, filed Apr. 6, 2006 on Polyacenes and Electronic Devices Generated Therefrom by Yuning Li et al.

U.S. application Ser. No. 11/399,064, filed Apr. 6, 2006 on Heteroacene Polymers and Electronic Devices Generated Therefrom by Yuning Li et al.

U.S. application Ser. No. 11/399,169, filed Apr. 6, 2006 on Ethynylene Acene Polymers and Electronic Devices Generated Therefrom by Yuning Li et al.

U.S. application Ser. No. 11/399,091, filed Apr. 6, 2006 on Ethynylene Acene Polymers by Yuning Li et al.

U.S. application Ser. No. 11/399,231, filed Apr. 6, 2006 on Poly[bis(ethynyl)heteroacenes] and Electronic Devices Generated Therefrom by Yuning Li et al.

U.S. application Ser. No. 11/399,141, filed Apr. 6, 2006 on Semiconductors and Electronic Devices Generated Therefrom by Yiliang Wu et al.

U.S. application Ser. No. 11/399,230, filed Apr. 6, 2006 on Semiconductor Polymers by Yiliang Wu et al.

U.S. application Ser. No. 11/398,941, filed Apr. 6, 2006 on Polydiazaacenes and Electronic Devices Generated Therefrom by Yiliang Wu et al.

U.S. application Ser. No. 11/398,902, filed Apr. 6, 2006 on Polydiazaacenes by Yiliang Wu et al.

U.S. application Ser. No. 11/398,931, filed Apr. 6, 2006 on Poly(alkynylthiophene)s and Electronic Devices Generated Therefrom by Beng S. Ong et al.

U.S. application Ser. No. 11/399,246, filed Apr. 6, 2006 on Poly(alkynylthiophene)s by Beng S. Ong et al.

U.S. application Ser. No. 11/399,092, filed Apr. 6, 2006 on Linked Arylamine Polymers and Electronic Devices Generated Therefrom by Yuning Li et al.

U.S. application Ser. No. 11/399,065, filed Apr. 6, 2006 on Linked Arylamine Polymers by Yuning Li et al.

U.S. application Ser. No. 11/011,678, Publication No. 20060124921 filed Dec. 14, 2004, relating to indolocarbazole moieties and thin film transistor devices thereof.

U.S. application Ser. No. 11/167,512, Publication No. 20060214155 filed Jun. 27, 2005, relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced copending applications and patent are totally incorporated herein by reference. In aspects of the present disclosure, there may be selected the appropriate substituents, such as a suitable hydrocarbon, a heteroatom containing group, hydrogen, halogen, source and gate electrodes, substrates, number of repeating polymer units, number of groups, and the like as illustrated in the copending applications.

BACKGROUND

The present disclosure is generally directed to semiconductors of the formulas/structures as illustrated herein, and processes of preparation and uses thereof. More specifically, the present disclosure in embodiments is directed to novel classes of substituted aromatic vinyl-based thiophene semiconductors of the formulas as illustrated herein which are believed to be more stable than, for example, acene-based semiconducting materials. These semiconducting materials can be dissolved or blended in a polymer binder for fabricating uniform thin films which can be selected as semiconductors for TFTs. Accordingly, in embodiments it is believed that the dissolved semiconductor molecules can crystallize out and form a continuous highly ordered semiconducting film to provide excellent TFT performance characteristics, such as efficient field effect charge carrier transport. In embodiments, the new semiconducting materials can be selected as semiconductors for thin-film transistors, and also which can be selected as solution processable and substantially stable channel semiconductors in organic electronic devices, such as thin film transistors, and which devices can be generated by economical solution processes, and which electronic devices are stable in air, that is do not substantially degrade over a period of time when exposed to oxygen.

There are desired electronic devices, such as thin film transistors, TFTs, fabricated with a semiconductor of the formulas as illustrated herein, and which semiconductors possess excellent solvent solubility, and which can be solution processable; and wherein these devices possess mechanical durability and structural flexibility characteristics which are desirable for fabricating flexible TFTs on a number of substrates, such as plastic substrates. Flexible TFTs enable the design of electronic devices with structural flexibility and mechanical durability characteristics. The use of plastic substrates together with the semiconductor of the formulas as illustrated herein can transform the traditionally rigid silicon TFT into a mechanically more durable and structurally flexible TFT design. This can be of particular value to large area devices such as large area image sensors, electronic paper, and other display media. Also, the selection of the semiconductors of the formulas as illustrated herein possess in embodiments extended conjugation for integrated circuit logic elements for low end microelectronics, such as smart cards, radio frequency identification (RFID) tags, and memory/storage devices, and enhance their mechanical durability, and thus their useful life span.

A number of semiconductor materials are not, it is believed, stable when exposed to air as they become oxidatively doped by ambient oxygen resulting in increased conductivity. The result is large off current and thus a low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Regioregular polyhexylthiophenes usually undergo rapid photo oxidative degradation under ambient conditions, while the know polytriarylamines possess some stability when exposed to air, however, these amines are believed to possess low field effect mobilities, disadvantages avoided or minimized with the polymers of the formulas as illustrated herein.

Also, acenes, such as pentacene and heteroacenes, are known to possess acceptable high field effect mobility when used as channel semiconductors in TFTs. However, these materials can be rapidly oxidized by, for example, atmospheric oxygen under light, and such compounds are not considered processable at ambient conditions. Furthermore, when selected for TFTs, acenes have poor thin film formation characteristics and are substantially insoluble, thus they are essentially nonsolution processable; accordingly, such compounds have been processed by vacuum deposition methods that result in high production costs, eliminated or minimized with the TFTs generated with the semiconductors illustrated herein.

A number of organic semiconductor materials has been described for use in field effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997); oligomers such as sexithiophenes or their variants, see for example reference F. Garnier et al., "Molecular engineering of organic semiconductors: Design of self-assembly properties in conjugated thiophene oligomers", *J. Amer. Chem. Soc., Vol.* 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett. Vol* 69, p4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags.

TFTs fabricated from p-type semiconductor polymers of the formulas illustrated herein may be functionally and structurally more desirable than conventional silicons and other semiconductors in that they may offer mechanical durability, structural flexibility, and the potential of being able to be incorporated directly onto the active media of the devices, thus enhancing device compactness for transportability. Also, a number of known small molecule or oligomer-based TFT devices rely on difficult vacuum deposition techniques for fabrication. Vacuum deposition is selected primarily because the materials selected are either insoluble or their solution processing by spin coating, solution casting, or stamp printing does not generally provide uniform thin films.

Further, vacuum deposition may also involve the difficulty of achieving consistent thin film quality for large area format. Polymer TFTs, such as those fabricated from regioregular components of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are sensitive to air. The TFTs fabricated from these materials in ambient conditions generally exhibit large off-current, very low current on/off ratios, and their performance characteristics degrade rapidly.

Additional references that may be of interest include U.S. Pat. Nos. 6,150,191; 6,107,117; 5,969,376; 5,619,357, 5,777,070 and 6,774,393.

BRIEF DESCRIPTION OF THE DRAWINGS

Illustrated in FIGS. 1 to 4 are various representative embodiments of the present disclosure, and wherein semiconductors of the formulas as illustrated herein are selected as the channel or semiconductor material in thin film transistor (TFT) configurations.

DESCRIPTION OF THE EXEMPLARY EMBODIMENTS

It is a feature of the present disclosure to provide semiconductors of the formulas as illustrated herein, which are useful for microelectronic device applications, such as TFT devices.

It is another feature of the present disclosure to provide semiconductors of the formulas as illustrated herein with a band gap of from about 1.5 eV to about 4 eV (electron volts) as determined from the absorption spectra of thin films thereof.

In yet a further feature of the present disclosure there are provided p-type semiconductors of the formulas illustrated herein which are useful as microelectronic components, and which semiconductors possess a solubility of, for example, at least about 0.1 percent to about 95 percent by weight in common organic solvents, such as methylene chloride, tetrahydrofuran, toluene, xylene, mesitylene, chlorobenzene, dichlorobenzene, trichlorobenzene and the like, and thus these semiconductors can be economically fabricated by solution processes such as spin coating, screen printing, stamp printing, dip coating, solution casting, jet printing, and the like.

Another feature of the present disclosure provides p-type semiconductors of the formulas as illustrated herein which can be dissolved or blended in a polymer binder resin for fabricating uniform thin films which can be selected as semiconductors for TFTs. Thus, in embodiments it is believed that the dissolved semiconductor molecules can crystallize out and form a continuous highly ordered semiconducting film to provide excellent TFT performance characteristics, such as efficient field effect charge carrier transport.

A process for the preparation of the semiconductor involves generating a dispersion or a solution comprised of (a) a continuous phase comprising a solvent, a binder resin, and an optional dispersing agent, and (b) a dispersed phase or a solution comprising the organic semiconductor material of the formulas illustrated herein. In embodiments the degree of solubility of the semiconductor material in the solvent may vary in embodiments of, for example, from 0 percent to about 100 percent solubility, and more specifically from 0.5 percent to about 100 percent solubility.

The binder resin and the optional dispersing agent in embodiments are substantially soluble in the solvent, inclusive of being completely dissolved in the solvent. However, the degree of solubility of the binder resin and the dispersing agent in the solvent may vary in embodiments from, for example, about 95 percent to 100 percent solubility by weight, and more specifically from about 99 percent to 100 percent solubility by weight.

In the dispersion (or the solution) and the semiconductor layer, the components can be present in various concentrations. For example, the semiconductor material is present in an amount of, for example, from about 20 percent to about 99.5 percent by weight, and more specifically, from about 60 percent to about 95 percent by weight, based on the total weight of the semiconductor material and the binder resin. The binder resin is present in an amount of, for example, from about 80 percent to less than about 1 percent by weight, and more specifically, from about 40 percent to about 5 percent by weight, based on the total weight of the semiconductor material and the binder resin. The ratio of optional dispersing agent to binder resin is, for example, from 0 to about 0.5 by weight, while the solvent is present in an amount of, for example, from about 10 percent to about 95 percent, and more specifically, from about 50 percent by weight to about 90 percent by weight, based on the total weight of the dispersion or the solution.

The binder resin functions primarily as a medium for the organic semiconductor materials to permit the semiconductor layer to be fabricated by a solution process, such as spin coating, dip coating, solution casting, stamp printing, or jet printing, and the like, to thereby form a uniform semiconductor layer. The binder resin, which is electrically insulating or semiconducting, may be selected for instance from a number of known oligomers and polymers as illustrated herein, and more specifically, poly(vinyl butyral), polyesters, polycarbonates, poly(vinyl chloride), polyacrylates and methacrylates, copolymers of vinyl chloride and vinyl acetate, phenoxy resins, polyurethanes, poly(vinyl alcohol), polyacrylonitrile, polystyrene, semiconductor polymers, such as polythiophenes, mixtures thereof and the like. Subsequent to the solvent evaporation from the coated dispersion or the coating solution, the binder resin usually forms a substantially smooth, continuous phase that adheres to the substrate and uniformly coats the semiconductor material. In embodiments, the binder resin may also function as a dispersant for the particles of the semiconductor material by minimizing agglomeration, increasing the dispersion uniformity, and preventing settling of the semiconductor material when the dispersion is stored.

A dispersing agent can be included in the semiconductor layer dispersion in an amount of, for example, from about 0.1 percent to about 50 percent, and more specifically, from about 1 percent to about 10 percent of the weight of the binder resin. Many types of dispersing agents are known (as described, for example, in the book "*McCutcheon's, Volume* 1: *Emulsifiers and Detergents*", published annually by McCutcheon's division, MC Publishing Co., 175 Rock Road, Glen Rock, N.J., 07452, the disclosure of which is totally incorporated herein by reference), including those dispersants illustrated herein such as ethoxylated long-chain alcohols, glyceryl stearates, alkanolamides, sodium lauryl sulfate, alkylnaphthalene sulfonates, and aliphatic-based phosphate esters; trimethyl cetyl ammonium chloride, oleic imidazoline and ethoxylated fatty amines, lecithin and polyglycol ether derivatives, and which agent primarily functions to stabilize the dispersed semiconductor material against flocculation, aggregation or sedimentation, and thereby maintains the dispersion in a finely divided state.

Another feature of the present disclosure resides in providing electronic devices, such as TFTs, with p-type semiconductors of the formulas as illustrated herein for organic thin film transistors, and which semiconductor layer has a conductivity of, for example, from about $10^{-4}$ to about $10^{-10}$ S/cm (Siemens/centimeter).

Also, in yet another feature of the present disclosure there are provided novel p-type semiconductors of the formulas as illustrated herein and devices thereof, and which devices exhibit enhanced resistance to the adverse effects of oxygen, that is, these devices exhibit relatively high current on/off ratios, and their performance does not substantially degrade as rapidly as similar devices fabricated with acenes or with regioregular poly(3-alkylthiophene-3,5-diyl).

Additionally, in a further feature of the present disclosure there is provided a class of novel p-type semiconductors of the formulas as illustrated herein with unique structural features which are conducive to molecular self-alignment under appropriate processing conditions, and which structural features also enhance the stability of device performance. Proper molecular alignment can permit higher molecular structural order in thin films, which can be of value to efficient charge carrier transport, and thus higher electrical performance.

There are disclosed in embodiments semiconductors of the formulas as illustrated herein and electronic devices thereof. More specifically, the present disclosure relates to semiconductor materials illustrated by or encompassed by Formula/Structure (I)

(I)

wherein each R' is independently hydrogen, a suitable hydrocarbon, such as alkyl, alkoxy, haloalkyl, aryl, substituted derivatives thereof, and the like; Ar is an aryl or heteroaryl substituent with, for example, from 6 to about 42 carbon atoms, such as phenyl, alkylphenyl, halophenyl like chlorophenyl, alkoxyphenyl, and the like; and M represents at least one thiophene based conjugated segment.

Examples of semiconductor components or materials (I) include, but are not limited to, those substituted aromatic vinyl-based thiophene semiconductors of the following formulas/structures

-continued (11)

(12)

(13)

(14)

(15)

wherein R' and Ar are as illustrated herein with respect to Formula (I); R represents suitable substituents on the aromatic and thiophene rings, respectively, and more specifically, R is a suitable hydrocarbon like alkyl, aryl, alkoxy, and substituted derivatives thereof; a halogen; hydrogen, and the like; m and n represent the number of substituents, and in embodiments are zero (0), 1, 2, 3, or 4; and x, y, and z represent the number of repeating units, or segments, for example, x can be a number of 1, 2, 3, 4, 5, or 6; y can be zero (0), 1, 2, 3, or 4; and z can be zero (0), 1, 2, and 3.

Alkyl includes, for example, those substituents with from about 1 to about 35 carbon atoms of, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, trifluoromethyl, perfluoroethyl perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl. Alkoxy includes, for example, those substituents with from about 1 to about 35 carbon atoms of, for example, methoxy, ethoxy, propoxy, butoxy, pentyloxy, hexyloxy, heptyloxy, octyloxy, nonyloxy, decyloxy, undecyloxy, dodecyloxy, tridecyloxy, tetradecyloxy, pentadecyloxy, hexadecyloxy, heptadecyloxy or octadecyloxy. Aryl examples are those groups with, for example, from about 6 to about 42 carbon atoms of, for example, phenyl, naphthyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, halophenyls like chlorophenyl, alkoxyphenyls, and the like.

Specific examples of the thiophene semiconductors are

-continued (l)

(m)

(n)

(o)

(p)

(q)

(r)

(s)

(t)

wherein R'', R''', and R'''' independently represent at least one of alkyl, or substituted alkyl groups with from about 1 to about 35 carbon atoms of, for example, but not limited to, an alkyl or substituted alkyl of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, trifluoromethyl, perfluoroethyl perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl, methoxy, ethoxy, propoxy, butoxy, pentyloxy, hexyloxy, heptyloxy, octyloxy, nonyloxy, decyloxy, undecyloxy, dodecyloxy, tridecyloxy, tetradecyloxy, pentadecyloxy, hexadecyloxy, heptadecyloxy or octadecyloxy, and substituted derivatives thereof, and the like.

The semiconductor materials can be prepared by a number of suitable methods, such as, for example, the processes as illustrated with reference to the following reaction Scheme 1

SCHEME 1 wherein R', Ar and M are as illustrated herein with respect to structure (I).

The semiconductors of the formulas/structures illustrated herein are believed to be soluble or substantially soluble in common coating solvents, for example, in embodiments they possess a solubility of at least about 0.1 percent by weight, and more specifically, from about 0.1 percent to about 10 percent, or to about 95 percent by weight in such solvents as methylene chloride, 1,2-dichloroethane, tetrahydrofuran, toluene, xylene, mesitylene, chlorobenzene, dichlorobenzene, and the like. Moreover, p-type semiconductors of the formulas as illustrated herein provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the semiconductors of the formulas disclosed when fabricated from solutions as thin films of, for example, from about 10 nanometers to about 500 nanometers, or from about 50 to about 300 nanometers in thickness materials are more stable in ambient conditions than similar devices fabricated from acene-based semiconducting materials or poly(3-alkylthiophene-2,5-diyl). When unprotected, the aforementioned p-type semiconductors of the formulas as illustrated herein and devices thereof are generally stable for a number of weeks, months rather than days, or hours as is the situation with from acene-based semiconducting materials or poly(3-alkylthiophene-2,5-diyl) after exposure to ambient oxygen, thus the devices fabricated from the semiconductors of the formulas as illustrated herein can provide higher current on/off ratios, and their performance characteristics do not substantially change as rapidly as acene-based semiconducting materials or poly(3-alkylthiophene-2,5-diyl) when no rigorous procedural precautions have been taken to exclude ambient oxygen during material preparation, device fabrication, and evaluation.

In further aspects of the present disclosure there is provided a thin film transistor comprised of a substrate, a gate electrode, a gate dielectric layer, a source electrode and a drain electrode, and in contact with the source/drain electrodes and the gate dielectric layer a semiconductor layer comprised of the semiconducting materials of formulas/structures illustrated herein; an electronic device comprising a semiconductive component, and wherein the device is a thin film transistor, and the component is selected from the group consisting of at least one of the formulas/structures (1) to (15) illustrated herein; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; the gate, source and drain electrodes are each comprised of gold, and the gate dielectric layer is comprised of the organic polymer poly(methacrylate), or poly(vinyl phenol); a device wherein the semiconductor layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; and thin film transistors thereof.

DESCRIPTION OF THE FIGURES

Figure 1:
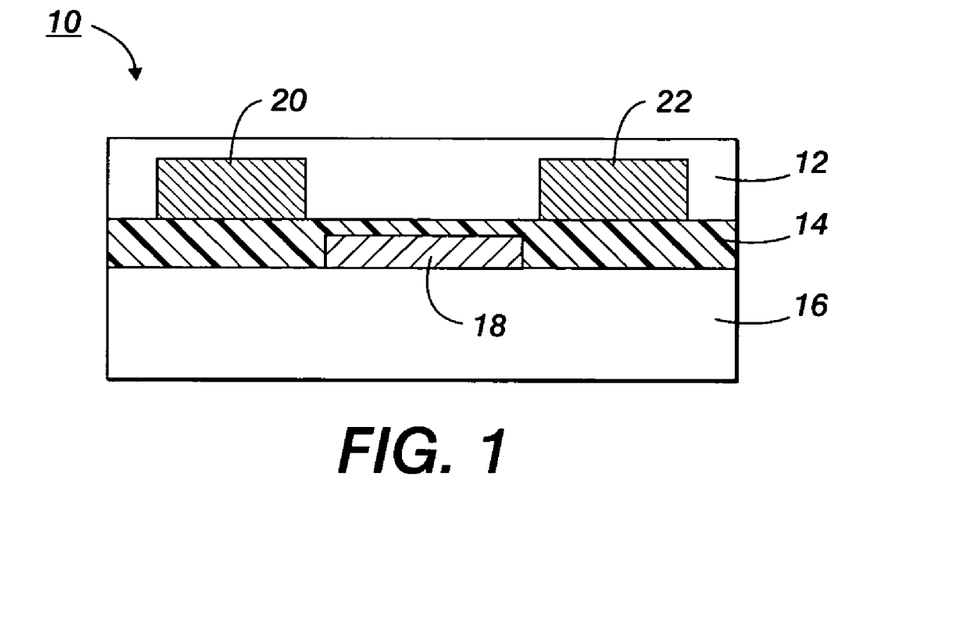

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 on top of which layer 14 two metal contacts, 20 and 22 (source and drain electrodes), are deposited. Over and situated between the metal contacts 20 and 22 is layer 12 comprised of the thiophene semiconductors encompassed by Formula/Structure (I), and more specifically, 2,5-bis[2-(4-pentylphenyl)vinyl]-thieno(3,2-b)thiophene, structure (a) where R represents pentyl.

The gate electrode can be included in the substrate, in the dielectric layer, and the like throughout.

Figure 2:
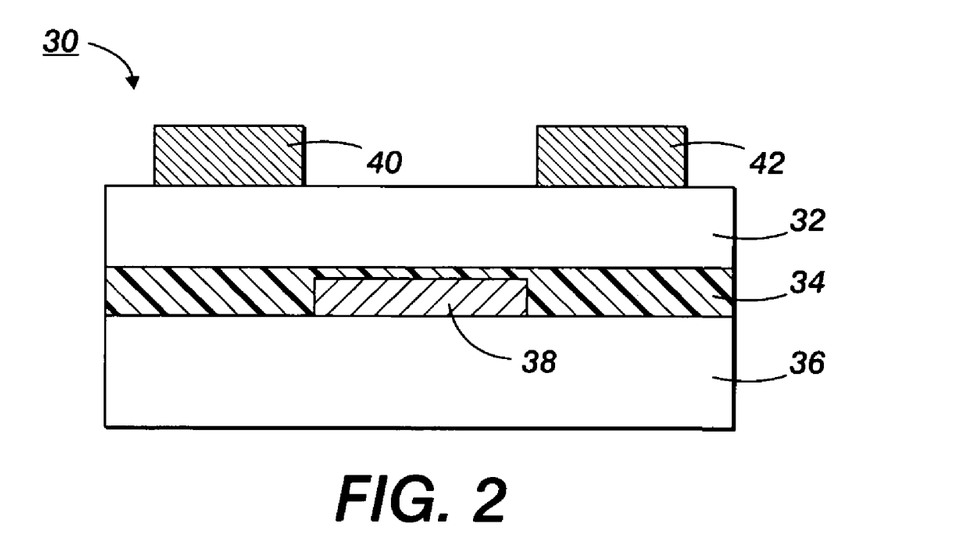

FIG. 2 schematically illustrates another TFT configuration 30 comprised of a substrate 36, a gate electrode 38, a source electrode 40, and a drain electrode 42, an insulating dielectric layer 34, and the semiconductor layer 32 of 2,5-bis[2-(4-pentylphenyl)vinyl]-thieno(3,2-b)thiophene, structure (a) where R represents pentyl.

Figure 3:
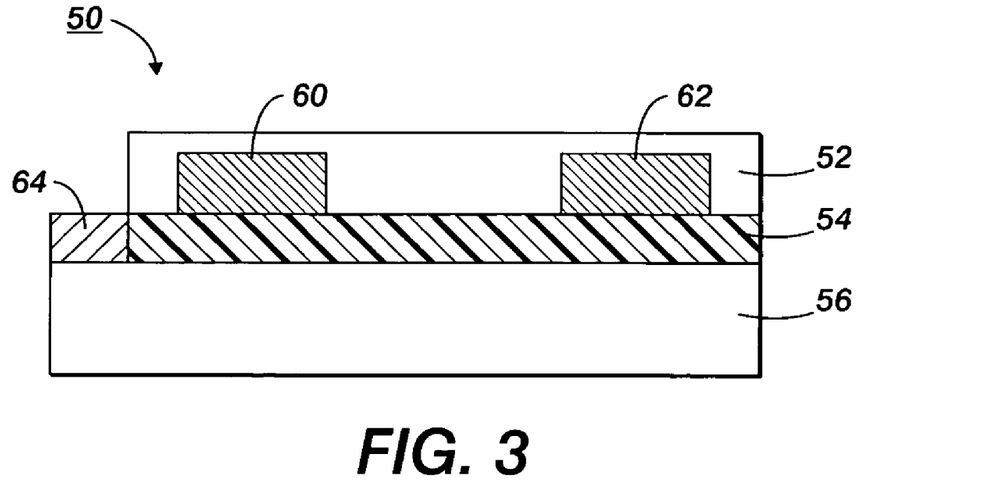

FIG. 3 schematically illustrates a further TFT configuration 50 comprised of a heavily n-doped silicon wafer 56, which can act as a gate electrode, a thermally grown silicon oxide dielectric layer 54, the thiophene semiconductor layer 52 of 2,5-bis[2-(4-pentylphenyl)vinyl]-thieno(3,2-b)

thiophene, in example structure (a) where R represents pentyl, on top of which are deposited a source electrode 60 and a drain electrode 62; and a gate electrode contact 64.

Figure 4:
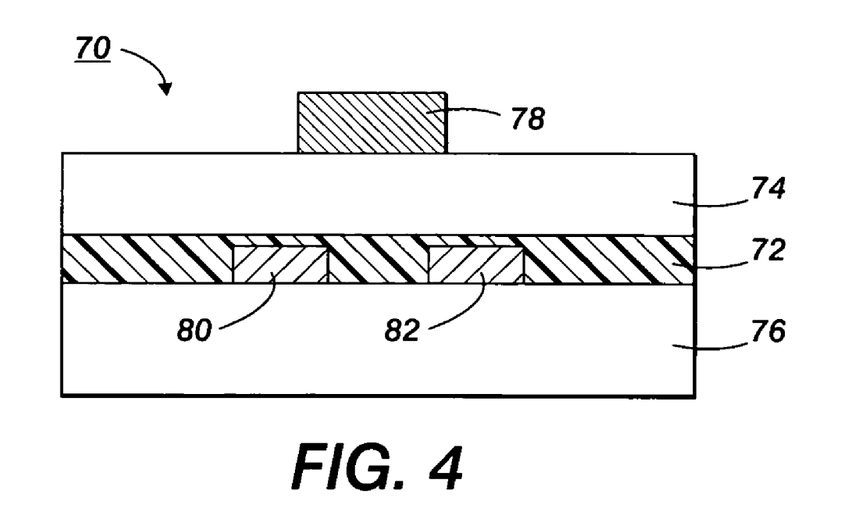

FIG. 4 schematically illustrates a TFT configuration 70 comprised of substrate 76, a gate electrode 78, a source electrode 80, a drain electrode 82, the p-type semiconductor 2,5-bis[2-(4-pentylphenyl)vinyl]-thieno(3,2-b)thiophene, layer 72, and an insulating dielectric layer 74.

Also, other devices not disclosed, especially TFT devices, are envisioned, reference, for example, known TFT devices. For example, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments, and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin, and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of p-type semiconductors of the formulas as illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of p-type semiconductors of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG® available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally, for example, about +10 volts to about −80 volts is applied to the gate electrode.

The following Examples are provided:

EXAMPLE I (a) Preparation of 2,5-Bis[2-(4-pentylphenyl)vinyl]-thieno(3,2-b) thiophene; Structure (a) Where R Represents Pentyl To a 500 milliliter 3-necked reaction flask containing 2,5-dibromo-thieno[3,2-b]thiophene (3.01 grams, 10.10 mmol) and toluene (80 milliliters) fitted with a magnetic stirrer bar, argon line and a condenser, a solution of 2-[2-(4-pentylphenyl)vinyl]-4,4,5,5-tetramethyl-1,3,2-dioxaborolane (7.580 grams, 25.2 mmol) in toluene (20 milliliters) was added. The mixture resulting was stirred at room temperature, about 23° C. to about 26° C., under argon atmosphere until the above reactants were dissolved. Sodium carbonate (4.91 grams dissolved in 23.16 grams of distilled water; 2M), the phase-transfer agent ALIQUAT™ 336 (2.02 grams, 5 mmol) in toluene (25 milliliters), terakis(triphenylphosphine)palladium(0) (0.233 gram, 0.202 mmol) were added, respectively. The resulting reaction mixture was heated with stirring to 90° C., and refluxed at this temperature for three days. During the reaction, thin layer chromatography (TLC) analysis was used to monitor the completion of the reaction. The reaction mixture was allowed to cool to room temperature, and the precipitate generated was collected by filtration and washed with methanol, yielding a shiny yellowish crude product (4.20 grams). The product was further purified by recrystallization from a mixture of toluene (300 milliliters) and chlorobenzene (100 milliliters), and dried under vacuum at room temperature, yielding 3.57 grams (yield 73 percent) of the shiny yellowish flaked solid, 2,5-bis[2-(4-pentylphenyl)vinyl]-thieno(3,2-b)thiophene. Mass spectra analysis: 484.2259 ($C_{32}H_{36}S_2$, calculated: 484.2258); Melting Point: 320.45° C.

(b) OTFT (Organic Thin Film Transistor) Device Fabrication and Evaluation

A top-contact thin film transistor configuration as schematically illustrated, for example, in FIG. 3 was selected as the test device structure. The test device was built on a n-doped silicon wafer with a thermally grown silicon oxide layer with a thickness of about 200 nanometers thereon, and had a capacitance of about 15 nF/cm² (nanofarads per square centimeter), as measured with a capacitor meter. The wafer functioned as the gate electrode while the silicon oxide layer acted as the gate dielectric. The silicon wafer was first cleaned with isopropanol, argon plasma, isopropanol and air dried, and then immersed in a 0.1 M solution of octyltrichlorosilane (OTS-8) in toluene at 60° C. for 20 minutes. Subsequently, the wafer was washed with toluene, isopropanol and air dried. A 100 nanometers thick semiconductor layer of the above prepared thiophene compound (a) was deposited on the OTS-8 treated silicon wafer substrate by vacuum evaporation at a rate of 1 Å/s under a high vacuum of $10^{-6}$ torr with the substrate held at room temperature or at 60° C. Thereafter, the gold source and drain electrodes of about 50 nanometers were deposited on top of the semiconductor layer by vacuum deposition through a shadow mask with various channel lengths and widths, thus creating a series of transistors of various dimensions.

The performance of the above OTFT device with the Example I semiconductor was characterized using a Keithley 4200 SCS semiconductor characterization system in a black box (that is, a closed box which excluded ambient light) at ambient conditions. The field-effect mobility, μ, was calculated from the data in the saturated regime (gate voltage, $V_G$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, $C_i$ is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

The transfer and output characteristics of the devices indicated that the semiconductor is a p-type semiconductor. Using transistors with a dimension of W=5,000 μm and L=90 μm, the following properties were obtained:

| Substrate Temperature | Mobility (cm²/V · s) | Current On/Off Ratio |
|---|---|---|
| Room temperature | 0.027 | $10^5$ |
| 60° C. | 0.15 | $10^6$ |

EXAMPLE II (a) Preparation of 5,5'-Bis-[2-(4-pentylphenyl)-vinyl]-2,2'-bithiophene; Structure (b) Where R Represents Pentyl To a 500 milliliter 3-necked reaction flask containing 5,5-dibromo-2,2-bithiophene (3.25 grams, 10.01 mmol) and toluene (80 milliliters), and which flask was fitted with a magnetic stirrer bar, argon line and a condenser, a solution of 2-[2-(4-pentylphenyl)vinyl]-4,4,5,5-tetramethyl-1,3,2-dioxaborolane (7.51 grams, 25.2 mmol) in toluene (20 milliliters) was added. The mixture resulting was then stirred at room temperature, about 23° C. to about 26° C., under an argon atmosphere until all of the above reactants were dissolved. Sodium carbonate (4.91 grams dissolved in 23.16 grams distilled water, 2M), the phase-transfer agent ALIQUAT™ 336 (2.023 grams, 5.01 mmol) in toluene (25 milliliters), terakis(triphenylphosphine)palladium(0) (0.231 gram, 0.20 mmol) were then added. The reaction mixture obtained was heated with stirring to 90° C. and refluxed at this temperature for three days. The reaction mixture was allowed to cool to room temperature, and the resulting precipitate was collected by filtration and washed with methanol, yielding 3.3 grams of a shiny orange yellowish crucial product. The filtrate was poured into a separatory funnel and the organic layer was extracted with toluene, washed with water (3×250 milliliters), and dried with magnesium sulfate, $MgSO_4$. After removing the organic solvent, there were obtained 1.1 grams of shiny orange yellowish crucial product. The combined 4.4 grams of product were further purified by recrystallization from a mixture of toluene (300 milliliters) and chlorobenzene (100 milliliters), and dried under vacuum at room temperature, providing 3.4 grams (yield: 66 percent) of orange yellowish flaked solid, 5,5-bis[2-(4-pentylphenyl)vinyl]-2,2'-bithiophene. Mass spectra analysis: 510.2411 ($C_{34}H_{38}S_2$, calculated: 510.2415); Melting point: 214.39° C.

(b) OTFT Device Fabrication and Evaluation

A top-contact thin film transistor configuration and with the semiconductor of (a) above as schematically illustrated, for example, in FIG. 3 were selected as the test device structure. The device was fabricated and characterized using the same procedure as in Example I. Using transistors with a dimension of W=5,000 μm and L=90 μm, the following properties were obtained:

| Substrate Temperature | Mobility (cm²/V · s) | Current On/Off Ratio |
|---|---|---|
| Room temperature | 0.01 | $10^5$ |
| 60° C. | 0.05 | $10^6$ |

EXAMPLE III (a) Preparation of 5,5'''-Bis[2-(4-pentylphenyl)vinyl]-3,3'''-dodecyl-2,2':5',2":5",2'''-quarterthiophene; Structure (H) Where R Represents Pentyl and R' Represents Dodecyl To a 250 milliliter 3-necked reaction flask containing 5,5-dibromo-2,2-bithiophene (1.542 grams, 1.87 mmol) and toluene (20 milliliters), and which flask was fitted with a magnetic stirrer bar, an argon line, and a condenser, a solution of 2-[2-

(4-pentylphenyl)vinyl]-4,4,5,5-tetramethyl-1,3,2-dioxaborolane (1.402 grams, 4.67 mmol) in toluene (10 milliliters) was added. The resulting mixture was stirred at room temperature under argon atmosphere until the reactants were well dissolved. Sodium carbonate (0.92 gram dissolved in 4.34 grams of distilled water, 2M), the phase-transfer agent ALIQUAT™ 336 (0.377 gram, 0.93 mmol) in toluene (5 milliliters), terakis(triphenylphosphine)palladium(0) (0.233 gram, 0.20 mmol) were added then, respectively. The reaction mixture was then heated with stirring to 90° C. and refluxed at this temperature for three days. The reaction mixture was allowed to cool to room temperature and poured into a separatory funnel. The organic layer obtained was extracted with toluene, washed with water (3×250 milliliters), and dried with magnesium sulfate, MgSO$_4$. The red solid obtained after evaporation of the solvent was purified by column chromatography on silica gel with a mixed solvent of hexane and dichloromethane (hexane/dichloromethane: 70/30 by volume) and recrystallized from hexane yielding 1.2 grams (yield: 60 percent) of 5,5'''-bis[2-(4-pentylphenyl)vinyl]-3,3'''-dodecyl-2,2':5',2'':5'',2'''-quarterthiophene as a red solid product. Mass spectra analysis: 1011.40 (C$_{66}$H$_{90}$S$_4$, calculated: 1011.68); Melting point: 91.3° C.

(b) OTFT Device Fabrication and Evaluation

A top-contact thin film transistor configuration as schematically illustrated, for example, in FIG. 3 was selected as the test device structure. The silicon wafer substrate was cleaned and modified by the procedure described in Example I. Since the above prepared thiophene compound had good solubility in common organic solvents, a solution processed transistor can be prepared as follows. The above thiophene compound (10 milligrams) and a polystyrene binder (10 milligrams) were dissolved in 1 gram of chlorobenzene. The resulting solution was then filtrated with a 0.45 micron syringe filter and spin-coated onto the above modified cleaned substrate to form a thin semiconductor layer. After being dried in a vacuum oven to remove residual amounts of the solvent, gold source and drain electrodes of about 50 nanometers each in thickness were deposited on top of the semiconductor layer by vacuum deposition through a shadow mask with various channel lengths and widths thus creating a series of transistors of various dimensions. The performance of the transistors can then be evaluated using the procedure of Example I.

The above experimental data showed that the aromatic vinyl-based thiophene semiconductors were more stable than, for example, acene-based semiconducting materials and regioregular poly(3-alkylthiophene-2,5-diyl) semiconductor materials, which degrade in air very quickly. More specifically, the above prepared with the thiophene (a) thin film transistors evidenced excellent electronic properties with a mobility of up to 0.15 cm$^2$/V.s, and a large current on/off ratio up to 10$^6$. These semiconducting (a) thiophenes can be dissolved or blended in a polymer binder for fabricating uniform thin films which can be selected as semiconductors for electronic devices, such as TFTs, which are stable in ambient condition without substantial degradation over a period of time, such as one month, when exposed to oxygen.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a semiconductor, wherein said semiconductor comprises a compound selected from Formulas (2), (3) and (5) to (15):

(2)

(3)

(5)

(6)

(7)

(8)

-continued wherein R' is independently selected from hydrogen, alkyl, substituted alkyl, alkoxy, substituted alkoxy, aryl, and substituted aryl; R is selected from alkyl, substituted alkyl, alkoxy, substituted alkoxy, aryl, substituted aryl, halogen, and hydrogen; m and n represent the number of substituents; Ar is aryl; and x, y, and z represent the number of repeating units.

2. A device in accordance with claim 1 wherein said alkyl contains from 1 to about 35 carbon atoms, said alkoxy contains from 1 to about 25 carbon atoms, and said aryl contains from 6 to about 42 carbon atoms.

3. A device in accordance with claim 1 wherein said alkyl contains from 1 to about 12 carbon atoms, said alkoxy contains from 1 to about 10 carbon atoms, and said aryl contains from 6 to about 18 carbon atoms.

4. A device in accordance with claim 1 wherein said alkyl contains from 1 to 18 carbon atoms; said alkoxy contains from 1 to 18 carbon atoms; and said aryl is phenyl, naphthyl, methylphenyl (tolyl), ethylphenyl, propylphenyl, butylphenyl, pentylphenyl, hexylphenyl, heptyiphenyl, octylphenyl, nonylphenyl, decylphenyl, undecyiphenyl, dodecylphenyl, tridecylphenyl, tetradecylphenyl, pentadecylphenyl, hexadecylphenyl, heptadecylphenyl, octadecylphenyl, or halophenyl.

5. A device in accordance with claim 1 wherein m is zero (0), 1, 2, or 3; and n is 1, 2, 3, or 4.

6. A device in accordance with claim 1 wherein m is 1, 2, or 3, and n is 1, 2, 3, or 4.

7. A device in accordance with claim 1 wherein m is 1, and n is 1 or 2.

8. An electronic device comprising a semiconductor, wherein the semiconductor comprises a compound selected from Formulas (a) through (r);

-continued wherein R″, R‴, and R″″ are independently selected from alkyl having from 1 to about 35 carbon atoms, substituted alkyl having from 1 to about 35 carbon atoms, perfluoroalkyl having from 1 to 12 carbon atoms, alkoxy having from 1 to 18 carbon atoms, and alkoxy having from 1 to 18 carbon atoms.

9. The device of claim 8, wherein the device is a thin film transistor comprising a substrate, a gate electrode, a gate dielectric layer, a source electrode, a drain electrode, and a semiconducting layer containing the semiconductor; wherein said substrate is a plastic sheet of a polyester, a polycarbonate, or a polyimide; said gate source and drain electrodes are each independently comprised of silver, gold, nickel, aluminum, chromium, platinum, or indium titanium oxide, or a conductive polymer; and said gate dielectric layer is comprised of inorganic nitrides or oxides, or organic polymers, silicon nitride, or silicon oxide.

10. The device of claim 9, wherein said semiconductor layer is deposited by solution processes of spin coating, stamp printing, screen printing, jet printing, or deposited by vacuum deposition.

11. A device in accordance with claim 9 further including in said semiconductor layer at least one of a binder resin and a dispersing agent.

12. A device in accordance with claim 11 wherein said binder resin is at least one of an oligomer and a polymer of poly(vinyl butyral), polyesters, polycarbonates, poly(vinyl chloride), polyacrylates and methacrylates, copolymers of vinyl chloride and vinyl acetate, phenoxy resins, polyurethanes, poly(vinyl alcohol), polyacrylonitrile, and polystyrene.

13. A device in accordance with claim 11 wherein said dispersing agent is at least one of a nonionic component of ethoxylated alcohols, glyceryl stearate and alkanolamides; an anionic component of sodium lauryl sulfate, alkylnaphthalene sulfonates, and aliphatic-based phosphate esters; a cationic component of trimethyl cetyl ammonium chloride, oleic imidazoline, and ethoxylated fatty amines; or an amphoteric surfactant of lecithin, and polyglycol ether derivatives.

14. An electronic device comprising a semiconductor, wherein said semiconductor comprises a compound of formula (4):

wherein R' is independently selected from hydrogen, alkyl, substituted alkyl, alkoxy, substituted alkoxy, aryl, and substituted aryl; R is selected from alkyl, substituted alkyl, alkoxy, substituted alkoxy, aryl, substituted aryl, halogen, and hydrogen; m and n represent the number of substituents, where m is 0 or 1, and n is 0, 1, or 2; Ar is aryl; and x, y, and z represent the number of repeating units, where x is a number from 1 to 6, y is a number from 0 to 4, and z is a number from 1 to 3.

* * * * *